United States Patent
Wang

(10) Patent No.: US 6,879,031 B2
(45) Date of Patent: Apr. 12, 2005

(54) MULTI-CHIPS PACKAGE

(75) Inventor: Sung-Fei Wang, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/747,189

(22) Filed: Dec. 30, 2003

(65) Prior Publication Data
US 2004/0212065 A1 Oct. 28, 2004

(30) Foreign Application Priority Data
Apr. 23, 2003 (TW) .......................... 92109529 A

(51) Int. Cl.⁷ .......................... H01L 23/02; H01L 23/48
(52) U.S. Cl. ...................... 257/686; 257/706; 257/777; 257/778
(58) Field of Search ................. 257/686, 706, 257/707, 712, 713, 777, 778

(56) References Cited

U.S. PATENT DOCUMENTS

| | | | | |
|---|---|---|---|---|
| 6,479,903 B2 | * | 11/2002 | Briar | 257/778 |
| 6,503,776 B2 | * | 1/2003 | Pai et al. | 438/106 |
| 6,693,362 B2 | * | 2/2004 | Seyama et al. | 257/777 |
| 6,693,364 B2 | * | 2/2004 | Tao et al. | 257/783 |
| 6,713,856 B2 | * | 3/2004 | Tsai et al. | 257/686 |
| 2004/0012094 A1 | * | 1/2004 | Harper et al. | 257/777 |
| 2004/0164390 A1 | * | 8/2004 | Wang | 257/686 |
| 2004/0183556 A1 | * | 9/2004 | Wada et al. | 324/754 |

* cited by examiner

Primary Examiner—T. N. Quach
(74) Attorney, Agent, or Firm—Bacon & Thomas PLLC

(57) ABSTRACT

A multi-chips package at least comprises a substrate, an upper chip, a lower chip, a reinforced device, and a plurality of electrically conductive bumps. The upper chip is flip-chip bonded to the upper surface of the substrate and the lower chip is accommodated in the opening and flip-chip bonded to the upper chip. Furthermore, the reinforced device is mounted onto the back surface of the lower chip and the lower surface of the substrate. The coefficient of the thermal expansion of the reinforced device ranges from the coefficient of the thermal expansion of the substrate to the coefficient of the thermal expansion of the chip. In such a manner, the reinforced device can constrain the thermal deformation of the substrate so as to prevent the electrically conductive bumps connecting the first chip and the substrate from being damaged.

18 Claims, 2 Drawing Sheets

MULTI-CHIPS PACKAGE

BACKGROUND OF THE INVENTION

1. Field of Invention

This invention relates to a multi-chips package. More particularly, the present invention is related to a multi-chips package having a reinforced device for preventing the bumps, which connects the chip and the substrate, from being damaged and cracked.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly packages in miniature and the integrated circuits operation in high frequency, MCM (multi-chips module) packages are commonly used in said assembly package and electronic devices. Usually, said MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, conventional multi-chips module (MCM) packages shall be a multi-chips side-by-side package or a multi-chips stacked package. As shown in FIG. 1, it illustrates a multi-chips stacked package and said stacked package is formed by disposing an upper chip 110 on an upper surface 124 of a substrate 120 having an opening 122 formed therein by flip-chip bonding, disposing a lower chip 130 in the opening 122 and flip-chip bonding to the upper chip 110 so that the upper chip 110 covers the opening 122 and the lower chip 130. Generally speaking, the upper chip 110 and the lower chip 130 may be a memory chip and a logic chip respectively. In such an arrangement, the electrical signals generated from the memory chip and the logic chip are able to be integrated in the assembly package and then transmitted to external electronic devices through the solder balls 128 formed on the lower surface 126 of the substrate 120. Although such design can reduce the overall thickness of the assembly package and upgrade the electrical performance, the bumps 160 for connecting the upper chip 110 and the substrate 120 will be easily damaged due to the coefficient of thermal expansion of the upper chip 110 and the coefficient of thermal expansion of the substrate 120 are different from each other. As mentioned above, the coefficient of thermal expansion of the substrate 120 is about $16*10^{-6}$ ppm/° C. and the coefficient of thermal expansion of the upper chip is about $4*10^{-6}$ ppm/° C. Accordingly, the effect of CTE mismatch will cause the bumps 160 connecting the substrate 110 and the upper chip 120 easily damaged.

Therefore, providing another assembly package to solve the mentioned-above disadvantages is the most important task in this invention.

SUMMARY OF THE INVENTION

In view of the above-mentioned problems, an objective of this invention is to provide a multi-chips package having a reinforced device for preventing the bumps, which connects the chip and the substrate, from being damaged and cracked.

To achieve the above-mentioned objective, a multi-chips package is provided, wherein the multi-chips package mainly comprises a substrate, an upper chip, a lower chip, a reinforced device and a plurality of electrically conductive bumps. Therein, the substrate has an upper surface for disposing the upper chip and electrically connecting to the upper chip through the bumps. Said substrate further has opening for accommodating the lower chip and covered by the upper chip, and said lower chip is electrically connected to the upper chip by flip-chip bonding. In addition, a reinforced device is disposed below the back surface of the lower chip and mounted on the lower surface of the substrate via an adhesive. Specifically, the adhesive may be a thermally conductive epoxy. The coefficient of thermal expansion of the reinforced device ranges from the coefficient of thermal expansion of the chip to the coefficient of thermal expansion of the substrate, so the reinforced device can constrain the thermal deformation due to the change of the working temperature. Accordingly, it can avoid the bumps being damaged due to the effect of CTE mismatch between the upper chip and the substrate.

In summary, this invention provides a reinforced device mounted on the lower surface of the substrate and the back surface of the lower chip so as to constrain the thermal deformation of the lower chip and the substrate due to the change of the working temperature. In addition, when the upper chip has a larger thickness or is larger in size, a material having a similar coefficient of thermal expansion with that of the substrate shall be elected to be the material of the reinforced device. On the contrary, when the upper chip has a smaller thickness or is smaller in size, a material having a similar coefficient of thermal expansion with that of the chip shall be elected to be the material of the reinforced device.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The multi-chips package according to the preferred embodiment of this invention will be described herein below with reference to the accompanying drawings, wherein the same reference numbers refer to the same elements.

Figure 1:
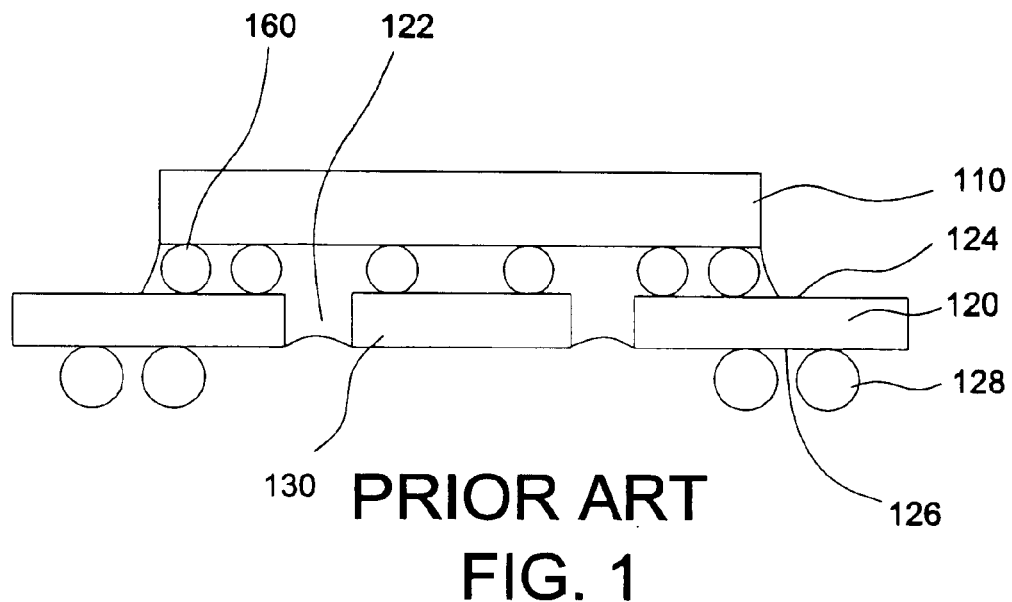
FIG. 1 is a cross-sectional view of the conventional multi-chips package.
Figure 2:
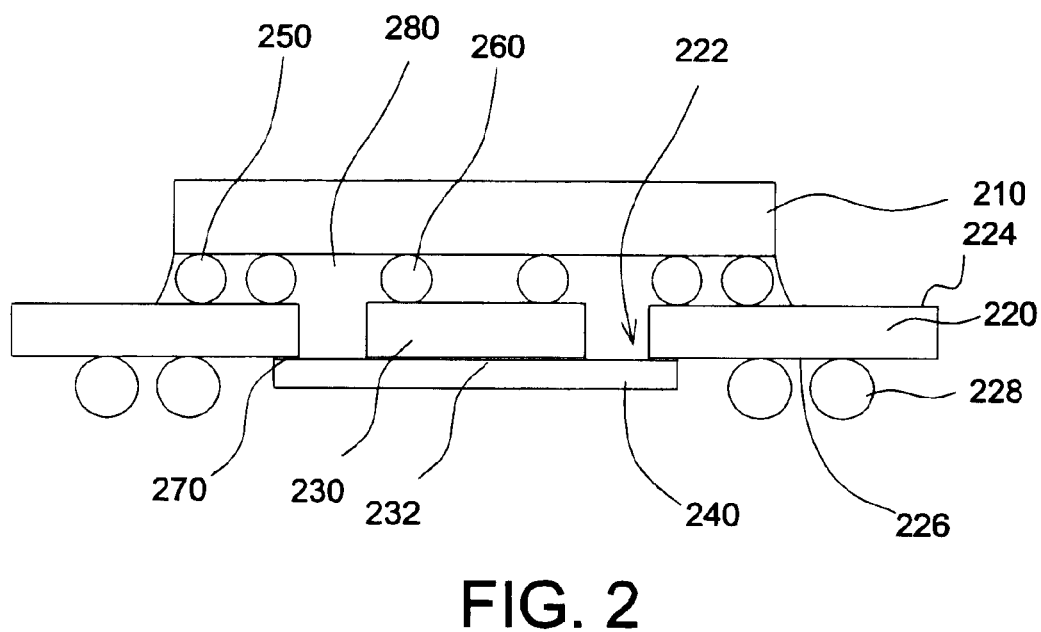
FIG. 2 is a cross-sectional view of a multi-chips package according to the first embodiment.

In accordance with a first preferred embodiment as shown in FIG. 2, there is provided a multi-chips package. The multi-chips package mainly comprises an upper chip 210, a substrate 220 having an opening 222, a lower chip 230, a reinforced device 240, a plurality of first electrically conductive bumps 250 and a plurality of second electrically conductive bumps 260. Therein, the upper chip 210 is mounted on the upper surface 224 of the substrate 220 via the first electrically conductive bumps 250 by flip-chip bonding technology, and the lower chip is disposed in the opening 222 and mounted on the upper chip 210 via the second electrically conductive bumps 260. Moreover, a reinforced device 240 is mounted on the back surface 232 of the lower chip 230 and the lower surface 226 of the substrate 220 via a thermally conductive adhesive 270. In addition, an underfill 280 is filled with the opening 222 of the substrate 220 to enclose the first electrically conductive bumps 250 and the second electrically conductive bumps 260 so as to prevent the first electrically conductive bumps 250 from being damaged for the reason that the coefficient of thermal expansion of the upper chip 210 mismatches with the coefficient of thermal expansion of the substrate 220. Besides, a plurality of solder balls 228 are formed on the lower surface 226 of the substrate 220 for electrically connecting to external electronic devices.

As mentioned above, when the upper chip 210 has a larger thickness or is larger in size, a material having a similar coefficient of thermal expansion with that of the substrate 220 shall be elected to be the material of the reinforced device 240. On the contrary, when the upper chip 210 has a smaller thickness or is smaller in size, a material having a similar coefficient of thermal expansion with that of the chip shall be elected to be the material of the reinforced device. In general, the coefficient of thermal expansion of the substrate 120 is ranges from about $14*10^{-6}$ ppm/° C. to $16*10^{-6}$ ppm/° C. and the coefficient of thermal expansion of the upper chip ranges from about $2*10^{-6}$ ppm/° C. to $4*10^{-6}$ ppm/° C., so the coefficient of thermal expansion of the reinforced device 240 shall be in the range from the coefficient of thermal expansion of the chip to the coefficient of thermal expansion of the substrate. Namely, the coefficient of thermal expansion of the reinforce device ranges from about $2*10^{-6}$ ppm/° C. to $16*10^{-6}$ ppm/° C. Accordingly, the reinforced device 240 can constrain the thermal deformation due to the change of the working temperature and avoid the first electrically conductive bumps 250 being damaged due to the effect of CTE mismatch between the upper chip and the substrate. Consequently, the reinforced device may be a dummy chip.

Figure 3:
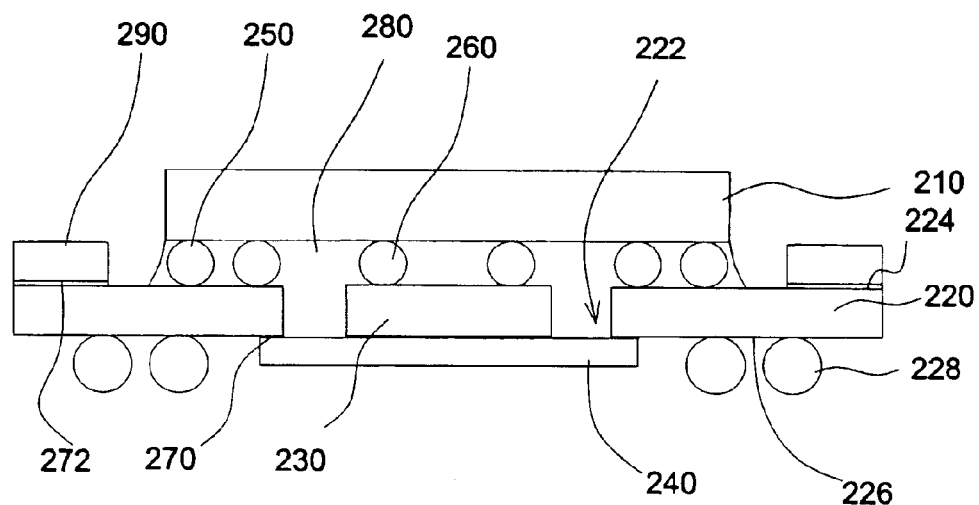
FIG. 3 is a cross-sectional view of a multi-chips package according to the second embodiment.

Next, as shown in FIG. 3, it illustrates a second preferred embodiment according to this invention. The difference of the second embodiment from the first one is that there is further provided a heat spreader 290 on the upper surface 224 of the substrate 220 via a thermally conductive adhesive 272. Because the coefficient of thermal expansion of the heat spreader 290 is different from the coefficient of thermal expansion of the substrate 220, the heat spreader 290 can constrain the thermal deformation of the substrate 220 due to the change of the working temperature and can avoid the first electrically conductive bumps 250 being damaged.

As mentioned above, when the upper chip 210 has a larger thickness or is larger in size, a material having a similar coefficient of thermal expansion with that of the substrate 220 may be elected to be the material of the heat spreader 290. On the contrary, when the upper chip 210 has a smaller thickness or is smaller in size, a material having a similar coefficient of thermal expansion with that of the chip shall be elected to be the material of the heat spreader 290. In general, the coefficient of thermal expansion of the substrate 120 ranges from about $14*10^{-6}$ ppm/° C. to about $16*10^{-6}$ ppm/° C. and the coefficient of thermal expansion of the upper chip ranges from about $2*10^{-6}$ ppm/° C. to $4*10^{-6}$ ppm/° C., so the coefficient of thermal expansion of the heat spreader 290 shall be in the range from the coefficient of thermal expansion of the chip to the coefficient of thermal expansion of the substrate. Namely, the coefficient of thermal expansion of the reinforce device ranges from about $2*10^{-6}$ ppm/° C. to $16*10^{-6}$ ppm/° C. Accordingly, not only the reinforced device 240 can constrain the thermal deformation of the substrate 220 but also the heat spreader 290 can constrain the thermal deformation of the substrate due to the change of the working temperature and avoid the first electrically conductive bumps 250 being damaged. Consequently, not only the heat spreader 290 can upgrade the thermal performance but also enhance the reinforcement of said reinforced device 240. It should be noted that the heat spreader 290 may a metal ring surrounding the upper chip 210 and disposed at the periphery of the upper surface 224 of the substrate 220. Consequently, said heat spreader 290 may be a dummy chip.

Figure 4:
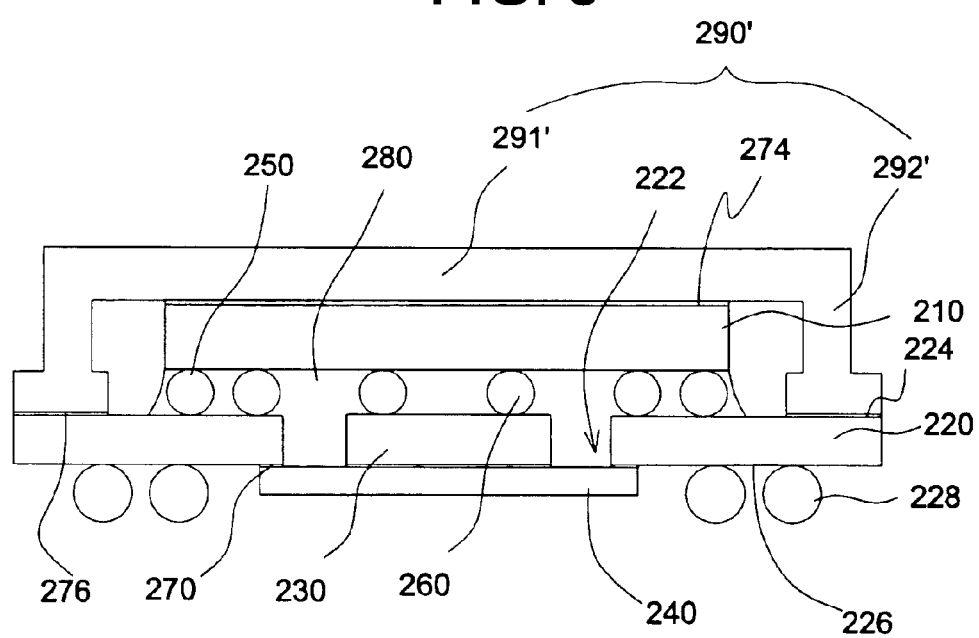
FIG. 4 is a cross-sectional view of a multi-chips package according to the third embodiment.

In addition, as shown in FIG. 4, it illustrates a fourth embodiment according to this invention. The difference of the fourth embodiment from the third one is that the heat spreader 290' is a cap-like metal having a connecting portion 291' and a supporting portion 292' wherein said connecting portion 291' is attached to the upper chip 210 via an adhesive 274 and said supporting portion 292' is attached to the substrate 220 via an adhesive 276 so as to have the heat spreader 290' covered the upper chip 210. Similarly, the coefficient of thermal expansion of the heat spreader 290 shall also be in the range from the coefficient of thermal expansion of the chip to the coefficient of thermal expansion of the substrate. Consequently, not only the heat spreader 290' can upgrade the thermal performance but also enhance the reinforcement of said reinforced device 240.

Although the invention has been described in considerable detail with reference to certain preferred embodiments, it will be appreciated and understood that various changes and modifications may be made without departing from the spirit and scope of the invention as defined in the appended claims.

What is claimed is:

1. A multi-chips package, comprising:

a substrate having an upper surface, a lower surface and an opening passing through the upper surface and the lower surface;

an upper chip having a first active surface and a back surface, wherein the first active surface of the upper chip faces the upper surface of the substrate and is connected to the substrate through a plurality of first electrically conductive bumps, and the upper chip covers the opening;

a lower chip having a second active surface and a second back surface, wherein the lower chip is mounted on the upper chip through a plurality of second electrically conductive bumps and disposed in the opening; and a reinforced device disposed on the second back surface of the lower chip and the lower surface of the substrate.

2. The multi-chips package of claim 1, wherein the coefficient of thermal expansion of the reinforced device ranges from the coefficient of thermal expansion of the upper chip to the coefficient of thermal expansion of the substrate.

3. The multi-chips package of claim 2, wherein the coefficient of thermal expansion of the upper chip ranges from about $2*10^{-6}$ ppm/° C. to $4*10^{-6}$ ppm/° C.

4. The multi-chips package of claim 2, wherein the coefficient of thermal expansion of the substrate ranges from about $14*10^{-6}$ ppm/° C. to $16*10^{-6}$ ppm/° C.

5. The multi-chips package of claim 1, wherein the coefficient of thermal expansion of the reinforce device ranges from about $2*10^{-6}$ ppm/° C. to $16*10^{-6}$ ppm/° C.

6. The multi-chips package of claim 1, further comprising an adhesive interposed between the lower chip and the reinforced device.

7. The multi-chips package of claim 1, further comprising an adhesive interposed between the substrate and the reinforced device.

8. The multi-chips package of claim 1, wherein the reinforced device is a dummy chip.

9. The multi-chips package of claim 1, further comprising an underfill enclosing the first electrically conductive bumps.

10. The multi-chips package of claim 1, further comprising an underfill enclosing the second electrically conductive bumps.

11. The multi-chips package of claim 1, further comprising a heat spreader disposed on the upper surface of the substrate.

12. The multi-chips package of claim 11, wherein the heat spreader surrounds the upper chip.

13. The multi-chips package of claim 11, wherein the heat spreader is disposed at the periphery of the upper surface of the substrate.

14. The multi-chips package of claim 11, wherein the heat spreader is a dummy chip.

15. The multi-chips package of claim 11, wherein the heat spreader is a metal cap.

16. The multi-chips package of claim 15, wherein the heat spreader comprises a connecting portion and a supporting portion, the supporting portion is connected to the substrate, and the connecting portion is connected to the upper chip.

17. The multi-chips package of claim 16, further comprising an adhesive interposed between the connecting portion and the first back surface of the upper chip.

18. The multi-chips package of claim 16, further comprising an adhesive interposed between the supporting portion and the upper surface of the substrate.

* * * * *